US012021096B2

(12) United States Patent
Tresnado et al.

(10) Patent No.: US 12,021,096 B2
(45) Date of Patent: Jun. 25, 2024

(54) RELIABLE SEMICONDUCTOR PACKAGES

(71) Applicant: UTAC Headquarters Pte. Ltd., Singapore (SG)

(72) Inventors: Dennis Fernandez Tresnado, Singapore (SG); Mario Arwin Simon Fabian, Singapore (SG); Wedanni Linsangan Micla, Singapore (SG); Allan Pumatong Ilagan, Singapore (SG)

(73) Assignee: UTAC Headquarters Pte. Ltd., Singapore (SG)

(*) Notice: Subject to any disclaimer, the term of this patent is extended or adjusted under 35 U.S.C. 154(b) by 223 days.

(21) Appl. No.: 17/342,546

(22) Filed: Jun. 9, 2021

(65) Prior Publication Data

US 2021/0391368 A1 Dec. 16, 2021

Related U.S. Application Data

(60) Provisional application No. 63/036,995, filed on Jun. 10, 2020.

(51) Int. Cl.

| | |
|---|---|
| ***H01L 23/04*** | (2006.01) |
| ***H01L 23/00*** | (2006.01) |
| ***H01L 23/10*** | (2006.01) |
| ***H01L 27/146*** | (2006.01) |

(52) U.S. Cl.

CPC ........ *H01L 27/14618* (2013.01); *H01L 23/04* (2013.01); *H01L 23/10* (2013.01); *H01L 23/562* (2013.01); *H01L 24/32* (2013.01); *H01L 27/14683* (2013.01); *H01L 24/73* (2013.01); *H01L 2224/32225* (2013.01); *H01L 2224/73265* (2013.01)

(58) Field of Classification Search

CPC ... H01L 27/14618; H01L 23/04; H01L 23/10; H01L 23/562; H01L 24/32; H01L 27/14683; H01L 24/73; H01L 2224/32225; H01L 2224/73265

See application file for complete search history.

(56) References Cited

U.S. PATENT DOCUMENTS

| | | | | |
|---|---|---|---|---|
| 10,083,896 | B1 | 9/2018 | Zhang et al. | |
| 11,515,220 | B2 * | 11/2022 | Hsu | H01L 23/10 |
| 2009/0102005 | A1 * | 4/2009 | Weng | H01L 27/14618 257/434 |
| 2013/0341747 | A1 * | 12/2013 | Lin | H01L 23/3114 257/432 |

* cited by examiner

*Primary Examiner* — Benjamin Tzu-Hung Liu

(74) *Attorney, Agent, or Firm* — HORIZON IP PTE. LTD.

(57) ABSTRACT

Semiconductor packages and methods for forming thereof are disclosed. The semiconductor package includes a package substrate having a die attach region with a die attached thereto. A protective cover is disposed over a sensor region of the die and attached to the die by a cover adhesive. The cover adhesive may serve as a standoff structure to support the protective cover. The standoff structure may be configured to form multiple cavities below the protective cover to reduce thermal stress on the protective cover. An encapsulant is disposed to cover the package substrate while leaving the top package surface exposed.

20 Claims, 16 Drawing Sheets

400

100

100

200

200

300

300

300

400

400

500

500

600

RELIABLE SEMICONDUCTOR PACKAGES

CROSS-REFERENCE TO RELATED APPLICATION

This application claims the benefit of U.S. Provisional Application No. 63/036,995, filed on Jun. 10, 2020, which is incorporated herein by reference in its entirety for all purposes.

FIELD OF THE INVENTION

The present disclosure relates to semiconductor packages and manufacturing methods of such packages. In particular, the present disclosure relates to semiconductor packages for sensor chips. More specifically, the present disclosure relates to semiconductor packages for image sensor chips.

BACKGROUND

Sensing devices generally include sensor chips used for receiving non-electrical signals from the surrounding environment. A sensor chip converts the non-electrical signals received into electrical signals that are transmitted to a printed circuit board. For example, an image sensor chip converts incoming light into an electrical signal that can be viewed, analyzed, and stored. Image sensors may be used in electronic imaging devices of both analog and digital types, which include digital cameras, camera modules and medical imaging equipment. Most commonly used image sensors may include semiconductor charge-coupled devices (CCD), active pixel sensors in complementary metal-oxide-semiconductor (CMOS), or N-type metal-oxide-semiconductor (NMOS, Live MOS) technologies.

Typically, a transparent glass cover is provided over the sensor area of the image sensor die. For example, the transparent glass cover forms a cavity over the sensor area. An adhesive is typically employed to attach the cover to the die. The cover permits light to reach the optically active area of the die while also providing protection for the die from the environment. An adhesive is typically employed to attach the cover to the die. An encapsulant is provided over the die and on the side edges of the transparent glass cover.

However, conventional packaging techniques for sensor devices face various issues. For example, the glass cover creates an air pocket in the cavity, which expands and contracts due to temperature changes, such as during temperature cycle testing. Such expansion and contraction cause stress on the glass cover. This may cause the glass cover to break, thus damaging the integrity of the cavity and therefore negatively impacting package reliability.

From the foregoing discussion, there is a desire to provide a reliable sensor package.

SUMMARY

Embodiments generally relate to semiconductor packages and methods for forming semiconductor packages.

In one embodiment, a method for forming a semiconductor package includes providing a package substrate having top and bottom major package substrate surfaces. The top major package surface includes a die attach region. The method further includes attaching a second major die surface of a die onto the die attach region, wherein a first major die surface of the die includes a sensor region and a cap bond region surrounding the sensor region, and forming a standoff structure on the cap bond region which is configured to define cavities surrounding the sensor region. The method also includes attaching a protective cover on the standoff structure. The protective cover seals the cavities to form sealed cavities configured to reduce thermal stress on the protective cover In another embodiment, a device includes a package substrate having top and bottom major package substrate surfaces and the top major package surface includes a die attach region. The device further includes a die having a second major die surface attached to the die attach region, wherein a first major die surface of the die includes a sensor region and a cap bond region surrounding the sensor region and a standoff structure on the cap bond region. The standoff structure is configured to define cavities surrounding the sensor region. The device also includes a protective cover attached to the standoff structure and the protective cover seals the cavities to form sealed cavities configured to reduce thermal stress on the protective cover.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of various embodiments. In the following description, various embodiments of the present disclosure are described with reference to the following, in which.

DETAILED DESCRIPTION

Figure 1A:
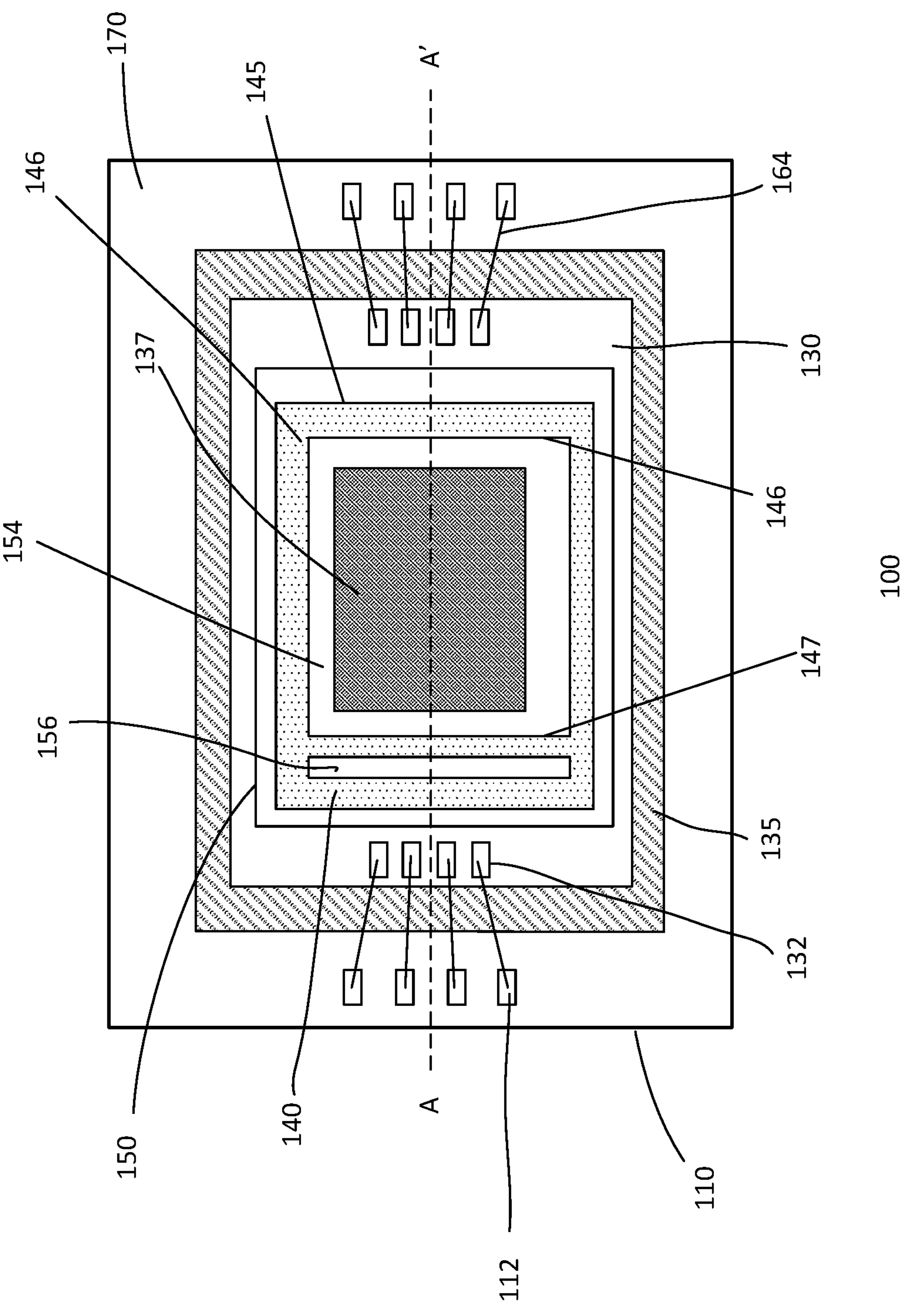
FIGS. 1_a_ to 1_c_ show top and side cross-sectional views of various embodiments of a semiconductor package.

Embodiments described herein generally relate to semiconductor packages and methods for forming the semiconductor packages. In some embodiments, the semiconductor package includes a sensor chip used for sensing environmental signals, such as optical signals or audio signals. The semiconductor package includes a cover over the sensor chip. The semiconductor package may include other types of chips with a cover thereover. The semiconductor package may be incorporated into electronic devices or equipment, such as sensing devices, navigation devices, telecommunication devices, computers and smart devices.

FIGS. 1_a_ to 1_c_ show top and side cross-sectional views of various embodiments of a semiconductor package 100. In particular, FIG. 1_a_ shows a top cross-sectional view of a semiconductor package 100 with a protective cover, and FIGS. 1_b_ to 1_c_ show cross-sectional views taken along the A-A of different semiconductor packages 100. The various embodiments include common elements. Common elements may not be described or described in detail.

The semiconductor package 100 includes a package substrate 110 having opposing first and second major surfaces 110*a* and 110*b*. The first major surface 110*a* may be referred to as the top or active package surface and the second major surface 110*b* may be referred to as the bottom package surface. Other designations for the surfaces may also be useful.

The package substrate may be a multi-layer substrate. For example, the package substrate includes a stack of electrically insulating substrate layers. The different layers of the package substrate 110 may be laminated or built-up. In one embodiment, the package substrate 110 is a laminate-based substrate including a core or intermediate layer sandwiched between top and bottom substrate layers. Other types of substrate, including ceramic and leadframe substrates, may also be useful. It is understood that the package substrate 110 may have various configurations, depending on design requirements.

The top package surface of the package substrate may be defined with die and non-die regions 102 and 104. The non-die region 104, for example, surrounds the die region 102. For example, the die region may be centrally disposed within the top package surface of the package substrate with the non-die region surrounding it. Providing a die region which is not centrally disposed within the top package surface may also be useful. The die region includes a die attach region for a die to be mounted thereto.

The top package surface of the package substrate may include package bond pads. In some embodiments, the top package surface of the package substrate includes package bond pads 112 disposed in the non-die region 104. For example, the package bond pads are disposed outside of the die attach region. The bottom package surface may include package contacts. The package contacts, for example, are electrically coupled to the package bond pads of the top package surface of the package substrate. For example, each package contact is coupled to its respective package bond pad. The package substrate may include one or more conductive layers embedded therein. The conductive layers may form interconnect structures including conductive traces and contacts for interconnecting the package contacts to package bond pads.

A die 130 is attached to the die attach region of the top package surface of the package substrate. The die, for example, includes first and second opposing major die surfaces 130*a* and 130*b*. The first major die surface may be referred to as a top or active die surface and the second major die surface may be referred to as a bottom or inactive die surface.

The die 130, as shown, is attached to the die attach region of the package substrate by a die adhesive 135. The adhesive may be a curable glue or adhesive tape. For example, a curing process may be performed to permanently attach the die to the die region. Other types of die adhesives may also be useful to attach the die to the die region. The bottom die surface 130*b* of the die, for example, contacts the die attach region. For example, the inactive die surface contacts the die attach region of the package substrate.

In one embodiment, the active die surface 130*a* includes a sensor region 137. For example, the die is a sensor chip. Other types of dies may also be useful. For example, the die may be a thermal or infrared (IR) image sensor chip. Other types of chips, for example, non-sensor chips, may also be useful. In the case of an image sensor chip, the sensor region may include a photosensitive sensor that may capture image information in response to light. The image sensor may be, for example, a CMOS or CCD type image sensor. In one embodiment, the sensor region includes an array of sensors. For example, each sensor may correspond to a pixel of an image. The sensor chip may include CMOS components embedded in the chip for controlling the sensor chip. Other configurations of the sensor chips may also be useful.

The active die surface 130*a* may include die bond pads 132 disposed outside of the sensor region. For example, the die bond pads may be disposed on the non-sensor region of the active surface of the die. The die bond pads are exposed by openings formed in a top passivation layer of the die. The surfaces of the die bond pads, for example, are substantially coplanar with the active surface of the die. Providing die bond pads with surfaces which are not coplanar with the active die surface may also be useful. The die bond pads provide external electrical connections to various components of the die. A conductive material, such as copper (Cu), aluminum (Al), Gold (Au), Silver (Ag), Nickel (Ni), solder material, or the alloys of these materials, or a combination thereof, may be used to form the die bonds pads. Other types of conductive material may also be useful. As shown, the die bond pads may be arranged into one or more rows disposed along the periphery of the active surface of the die. Other arrangements of the die bond pads may also be useful.

In one embodiment, a plurality of wire bonds 164 are provided to electrically connect the die bond pads 132 on the active surface of the die to the package bond pads 112 on the top package surface of the package substrate. The wire bonds enable external connection to the internal circuitry of the die. The wire bonds, for example, may be formed of any suitable metal material such as, but not limited to, Cu, Au, Ag, Al, or the alloys of these materials, or a combination thereof. Other types of conductive materials may also be used. The wire bonds 164 create electrical connections between the interconnect structures (e.g., bond pads, conductive traces, via contacts, terminal pads) of the package substrate 110 and the semiconductor die 130.

A protective cover or cap 150 is disposed on the active surface of the die 130 over the sensor region 137. The protective cover includes first or top and second or bottom opposing cover surfaces with sides or edges. The bottom cover surface, for example, is facing the die. The protective cover, for example, may be a glass cover which enables light to penetrate to the sensor in the region. Other types of protective covers may also be useful. For example, the protective cover may depend on the type of sensor. As shown, the protective cover has a rectangular shape. Providing a protective cover with other shapes may also be useful. The protective cover is configured to cover the sensor region to protect the sensor region. For example, the protective cover serves as a cap over the sensor region. Depending on the dimensions and shape of the protective cover, the protective cover may also cover non-sensor region surrounding the sensor region.

In one embodiment, the active die surface includes a cap bond region 140. The cap bond region, as shown, surrounds the sensor region 137. For example, the cap bond region is disposed in the non-sensor region of the active die surface and surrounds the sensor region. The cap bond region, in one embodiment, includes a standoff structure 145. For example, the standoff structure is disposed on the cap bond region on the active die surface and surrounding the sensor region.

The standoff structure is configured to attach the protective cover to the active die surface, forming a cavity over the sensor region. The cavity, for example, is disposed above and encloses the sensor region of the die. In one embodiment, the standoff structure includes an adhesive-based standoff structure configured for attaching the protective cover to the active die surface. The adhesive may be a curable adhesive. Preferably, the curable adhesive has a high transparency and high refractive index. Curable adhesives, such as epoxy, acrylic, polyimide, urethane, thiol, or a combination thereof, may be used to form the standoff structure. Other suitable adhesive materials may also be useful, depending on the desired refractive index of the protective cover. A curing process may be performed to permanently attach the protective cover to the die. The curing process, for example, may be performed to permanently attach the protective cover to the die attach region.

As discussed, the standoff structure forms a cavity surrounding the sensor region. In one embodiment, the standoff structure is configured or designed to form multiple cavities. In one embodiment, the standoff structure is configured to form a cavity having multiple cavities. For example, the standoff structure is configured to form at least two cavities.

In one embodiment, the standoff structure is configured to form a primary cavity 154 and a secondary cavity 156. The primary cavity surrounds the sensor region while the secondary cavity abuts the primary cavity. In other embodiments, the standoff structure is configured to form a primary cavity and multiple secondary cavities. The secondary cavities can abut the primary cavity, another secondary cavity, multiple other secondary cavities, or a combination thereof. For example, the standoff structure is configured to form a cavity with n cavities, where n is greater than 1, wherein the n cavities include 1 primary cavity and x secondary cavities, where x is equal to n−1. The standoff structure may be configured to include between 2 to 9 cavities (n=2 to 9). Providing a standoff structure with other numbers of cavities, such as greater than 9, may also be useful.

In one embodiment, the outline or footprint of the cap bond region serves to accommodate outer standoff structure walls 146 of the standoff structure 145. The outer standoff structure walls, for example, are adhesive-based outer standoff structure walls. The outer standoff structure walls define the shape or footprint of the overall standoff structure based on the cap bond region footprint. As shown, the shape of the footprint of the cap bond region is rectangular-shaped. For example, four outer standoff structure walls 146 define the footprint of the cap bond region. Other shaped footprints for the cap bond region may also be useful. Additionally, the outer standoff structure walls also serve to define a cavity region between the protective cover and the active die surface. To separate the cavity region into multiple cavities, the standoff structure may be provided with one or more internal standoff structure walls 147. The internal standoff structure walls, for example, are adhesive-based internal standoff structure walls. The number of internal standoff structure walls may depend on the number of cavities as well as the design or layout of the cap bond region. As shown, the shape of the cavities within the standoff structure is rectangular. Providing other shaped cavities may also be useful. The shape of the cavities may depend on the layout of, for example, the internal standoff structure walls. Also, to minimize the cap bond region footprint, the primary cavity preferably is the largest while the secondary cavity or cavities are smaller in size. Other configurations of standoff structures may also be useful.

In one embodiment, as shown, the standoff structure 145 is configured to form 2 cavities between the protective cover and the active die surface. The standoff structure includes outer or external standoff structure walls 146 based on the outline of the cap bond region. The outer standoff structure walls define a rectangular-shaped cap bond region footprint. For example, the standoff structure includes four outer standoff structure walls which define a rectangular-shaped cap bond region. The standoff structure includes an internal standoff structure wall 147 which separates the cavity region into a primary cavity 154 surrounding the sensor region and a secondary cavity 156 adjacent and abutting the primary cavity. For example, the internal standoff structure wall and major portions of first and second opposing outer standoff structure walls which are adjacent to the internal standoff structure wall and a third outer standoff structure wall define the primary cavity surrounding the sensor region; the internal standoff structure wall and minor portions of the first and second opposing outer standoff walls and the fourth outer standoff structure wall define the secondary cavity. As such, the secondary cavity does not encroach onto the sensor region.

As discussed, to minimize the cap bond region footprint, the primary cavity, is larger and occupies a major area of the cavity region within the outer standoff structure walls and the secondary cavity has dimensions smaller than that of the primary cavity. For example, the secondary cavity occupies a minor area of the cavity region. As shown, the secondary cavity 156 occupies a side of the cavity region. For example, the secondary cavity is a side secondary cavity located along a side of the cavity region. As shown, the cavities are rectangular-shaped cavities. Providing other shapes for the cavities may also be useful.

In one embodiment, the standoff structure is configured with a predefined or predetermined height. Preferably, both the outer and internal standoff structure walls of the standoff structure have the same height. This facilitates the overall standoff structure in maintaining the height of the cavities in the cavity region between the protective cover and active die surface at the predetermined height. The predetermined height, for example, should be sufficient to ensure that the protective cover does not contact either the wire bonds or the sensor region during the packaging process. For example, the predetermined height may be about 100 to 150 microns. In one embodiment, depending on the configuration of the die, the predetermined height may be different. For example, a predetermined height is set based on dimensions of an active die area. The predetermined height may also be determined based on a wire loop height of the wire bonds formed on the die. For example, for a die with a low wire loop design (low wire loop height), the predetermined height is about 60 to 100 microns. Other predetermined heights for the standoff structures or cavities may also be useful.

As both the outer and internal standoff structure walls are configured to attach the protective cover to the die, the increased adhesion strength of the protective cover to the die provides for a package with an overall improved shear strength.

When attached, the protective cover seals the cavities in the cavity region. For example, the sensor region with the cavities above is sealed by the protective cover. The sealed cavities may be air cavities. The air cavities reduce thermal stress on the protective cover during temperature cycle tests. One result of thermal stress is peeling of a passivation layer from the die active surface. Smaller air cavities have reduced air volume. During thermal stress, which results from temperature cycle tests, the reduced air volume results in reduced pull-force on the passivation layer during expansion and contraction. Thus, preventing peeling of the passivation layer and increase robustness of the package. As such, the protective cover exhibits a lower thermal expansion coefficient during temperature cycle tests which therefore improves package reliability.

As shown, the die bond pads 132 are disposed on the active surface of the die outside of the cap bond region 140. As such, the wire bonds 164 are disposed completely outside of the cap bond region. Other configurations of die bond pads and wire bonds may also be useful. For example, the die bond pads may be disposed on the periphery of the cap bond region or a combination of cap bond region and outside of the cap bond region.

An encapsulant 170 is disposed on the package substrate. The encapsulant 170 covers the package substrate, exposed portions of the die and sides of the protective cover 150. For example, the encapsulant is configured to adhere to the sides of the cover while leaving the top of the cover exposed. For example, the encapsulant 170 extends into the non-die region 104 of the semiconductor package 100 to cover the exposed top surface of the package bond pads in the top package surface 110*a*. The encapsulant may be formed using ceramic, plastic, epoxy, or a combination thereof. Providing other materials to form the encapsulant may also be useful. The standoff structure may serve as a stopper to prevent encapsulant material from leaking into the sensor region during the encapsulation process while maintaining the cavity height at the predetermined height. As a result, the reliability of the package is increased.

Figure 1B:
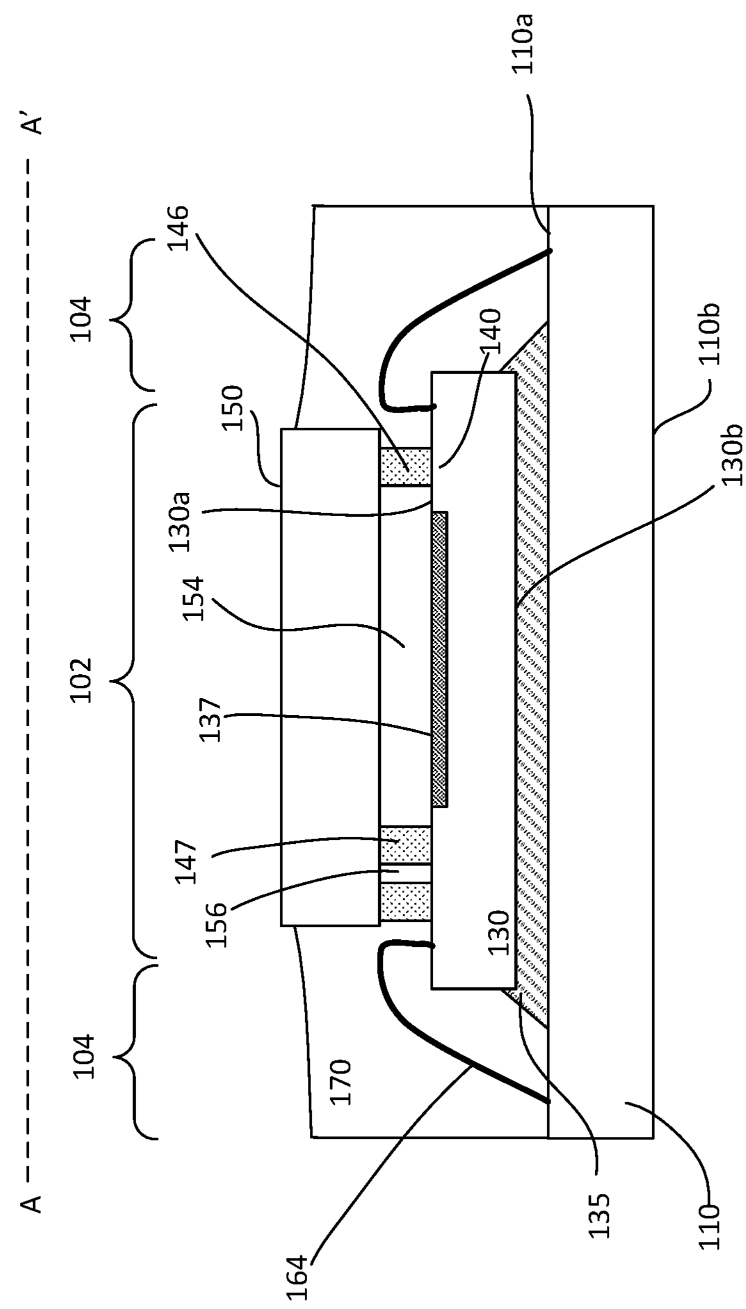
Figure 1C:
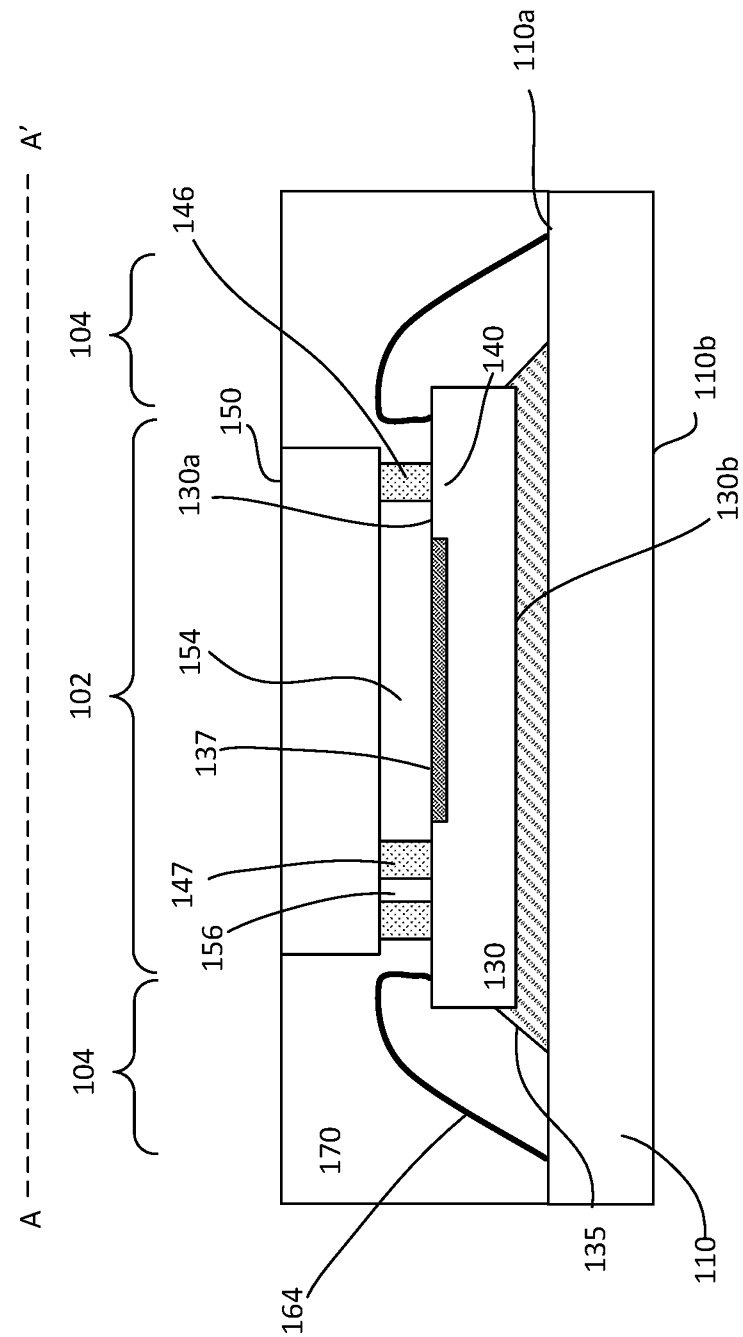

In one embodiment, as shown in FIG. 1*b*, the topmost surface of the encapsulant 170 may be formed slightly below the top surface of the protective cover 150 and slopes downwardly from the protective cover towards a perimeter of the non-die region 104. For example, a liquid encapsulant is used. Alternatively, as shown in FIG. 1*c*, the encapsulant 170 may be formed with vertical sidewalls and a substantially planar top surface that is about level with the top surface of the protective cover 150. For example, the encapsulant is a solid mold compound. The encapsulant provides a rigid and mechanically strong structure to protect the sensor region from the environment. For example, the encapsulant protects the sensor region from moisture and provides the protective cover with mechanical support.

Figure 2A:
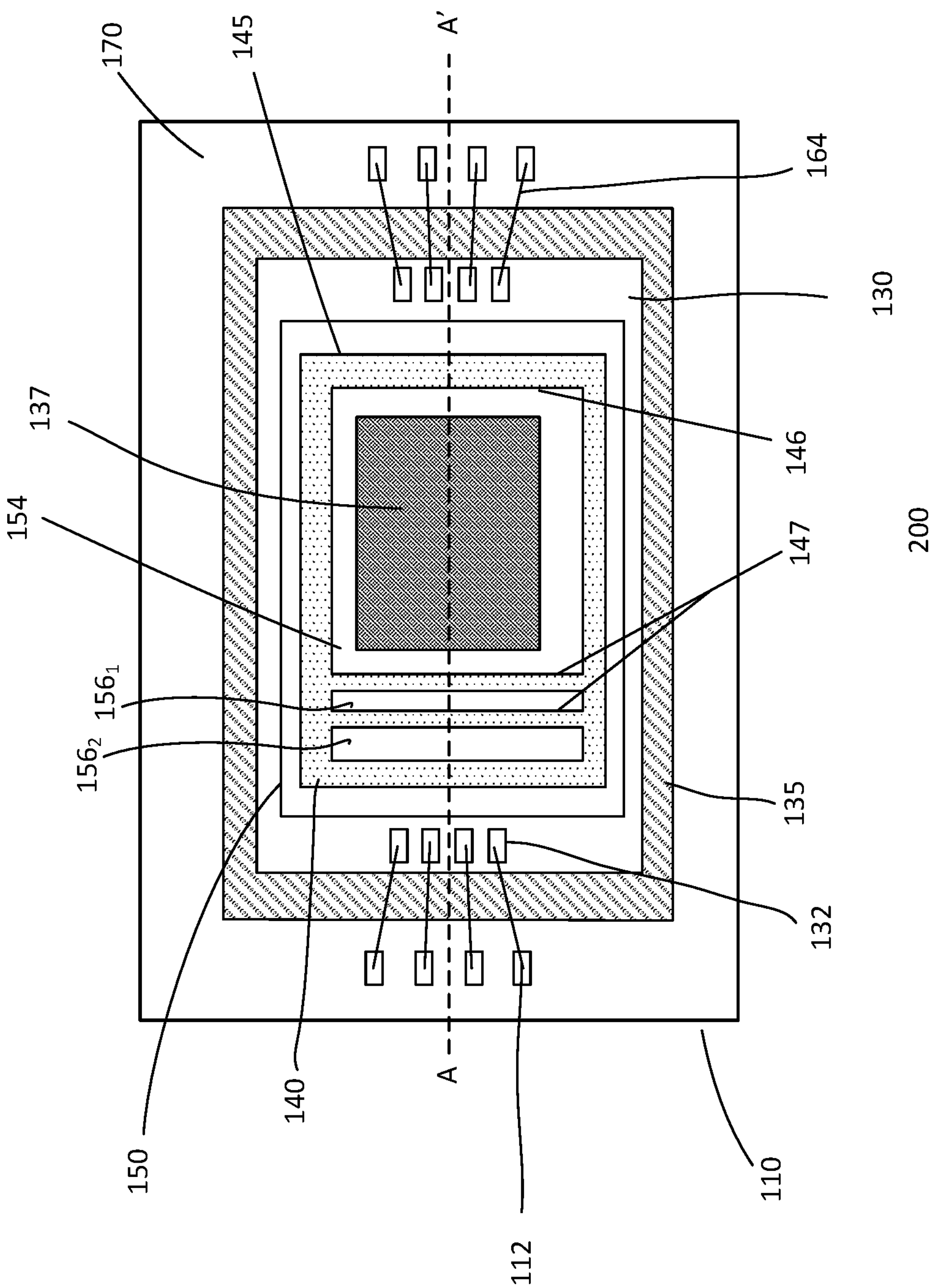
FIGS. 2_a_ to 2_c_ show top and side cross-sectional views of various embodiments of another semiconductor package.
Figure 2B:
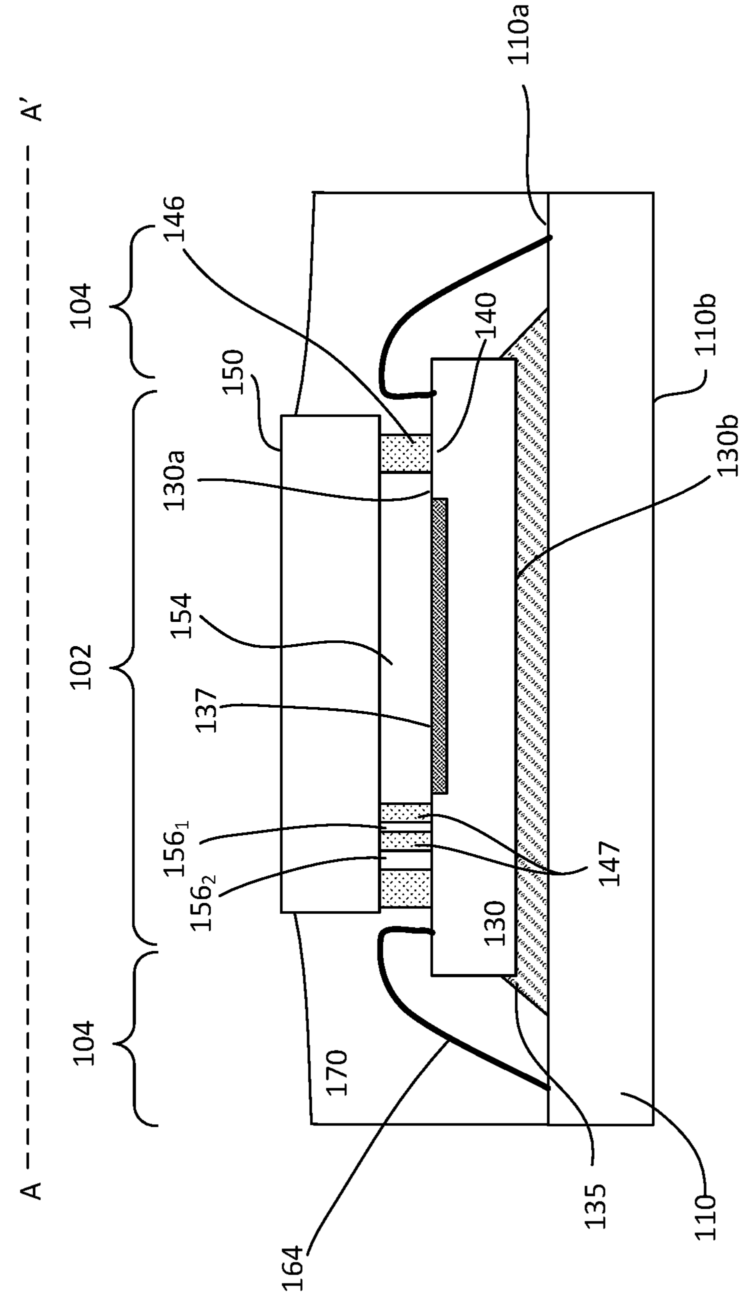
Figure 2C:
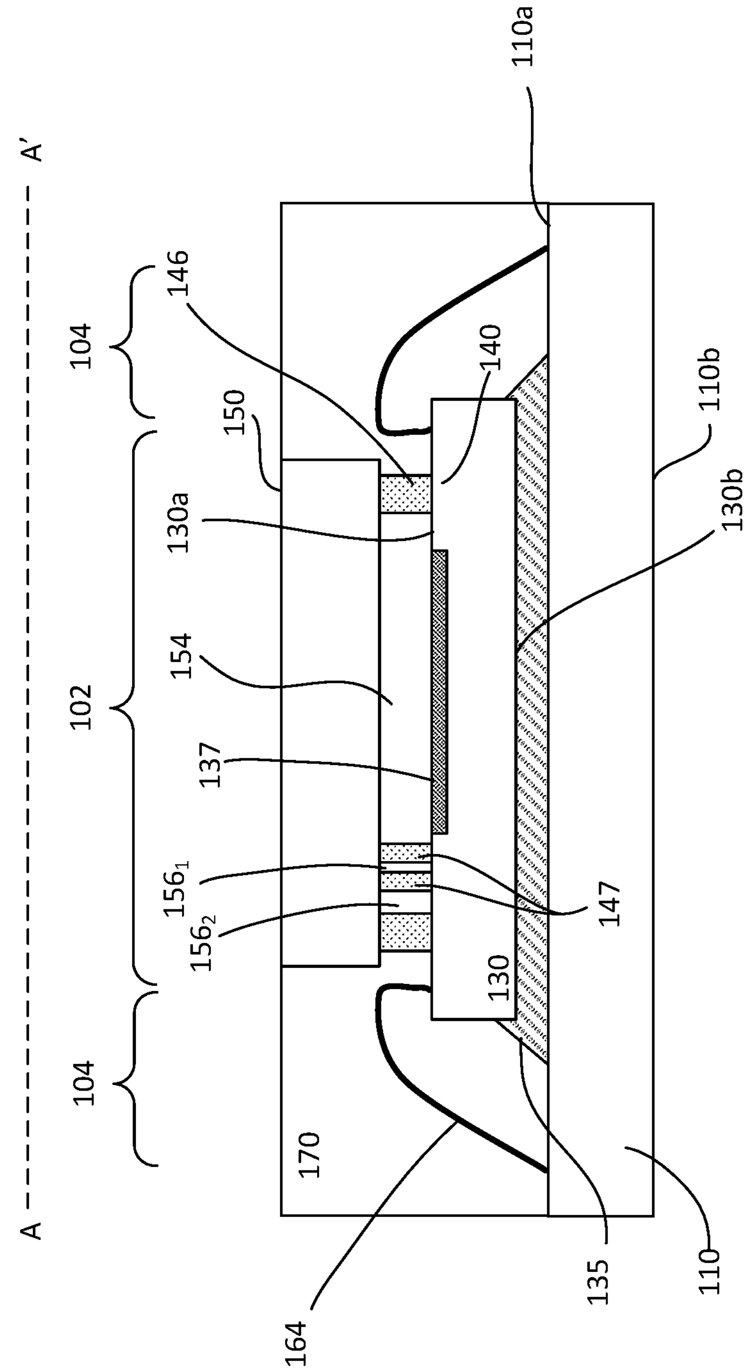

FIGS. 2*a* to 2*c* show top and side cross-sectional views of various embodiments of a semiconductor package 200. In particular, FIG. 2*a* shows a top cross-sectional view of a semiconductor package 200 with the package cover, and FIGS. 2*b* to 2*c* show side cross-sectional views taken along the A-A of different semiconductor packages. The various embodiments include common elements. Common elements may not be described or described in detail.

The package 200 is similar to that described in FIGS. 1*a* to 1*c*. However, unlike FIGS. 1*a* to 1*c*, the standoff structure is configured to form 3 cavities in the cavity region between the protective cover and the active die surface. For example, the cavity region includes 1 primary cavity and 2 secondary cavities.

As shown, the standoff structure 145 includes outer standoff structure walls 146 disposed on the outline of the cap bond region 140. The outer standoff structure walls define a rectangular-shaped cap bond region footprint. For example, the standoff structure includes four outer standoff structure walls which define a rectangular-shaped cap bond region. In one embodiment, the standoff structure includes internal standoff structure walls 147 which separate the cavity region into a primary cavity 154 surrounding the sensor region and 2 secondary cavities $\mathbf{156}_{1\text{-}2}$ adjacent to the primary cavity. The secondary cavities can abut the primary cavity, one of the secondary cavities, or a combination thereof. For example, as shown, a first secondary cavity $\mathbf{156}_1$ is adjacent and abutting the primary cavity and a second secondary cavity $\mathbf{156}_2$ abuts the first secondary cavity.

The primary cavity, as discussed, is larger and occupies a major area of the cavity region while the secondary cavities have dimensions smaller than that of the primary cavity and occupy a minor area of the cavity region. For example, the secondary cavity is a side secondary cavity located along a side of the cavity region. The cavities may be rectangular-shaped cavities. Providing other shapes or configurations for the cavities may also be useful.

Figure 3A:
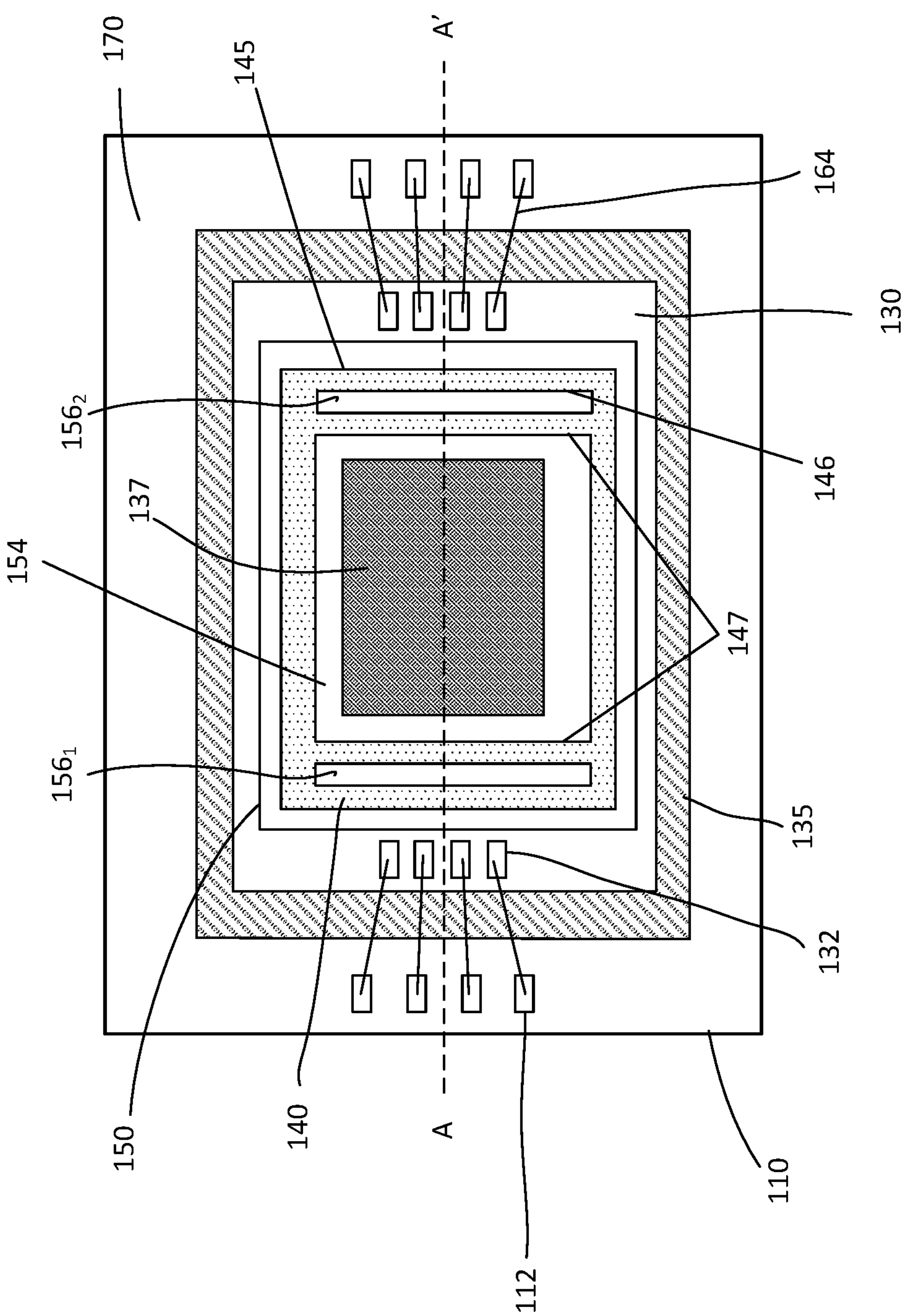
FIGS. 3_a_ to 3_c_ show top and side cross-sectional views of various embodiments of another semiconductor package.
Figure 3B:
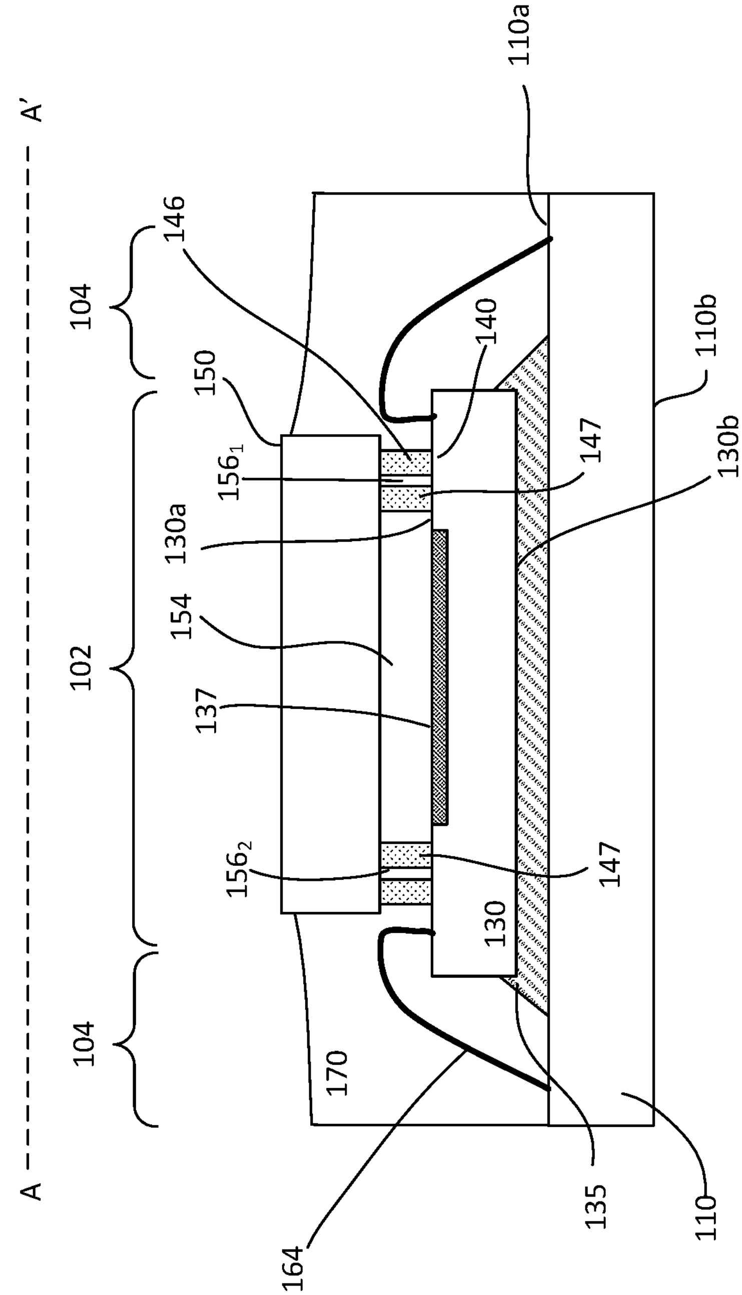
Figure 3C:
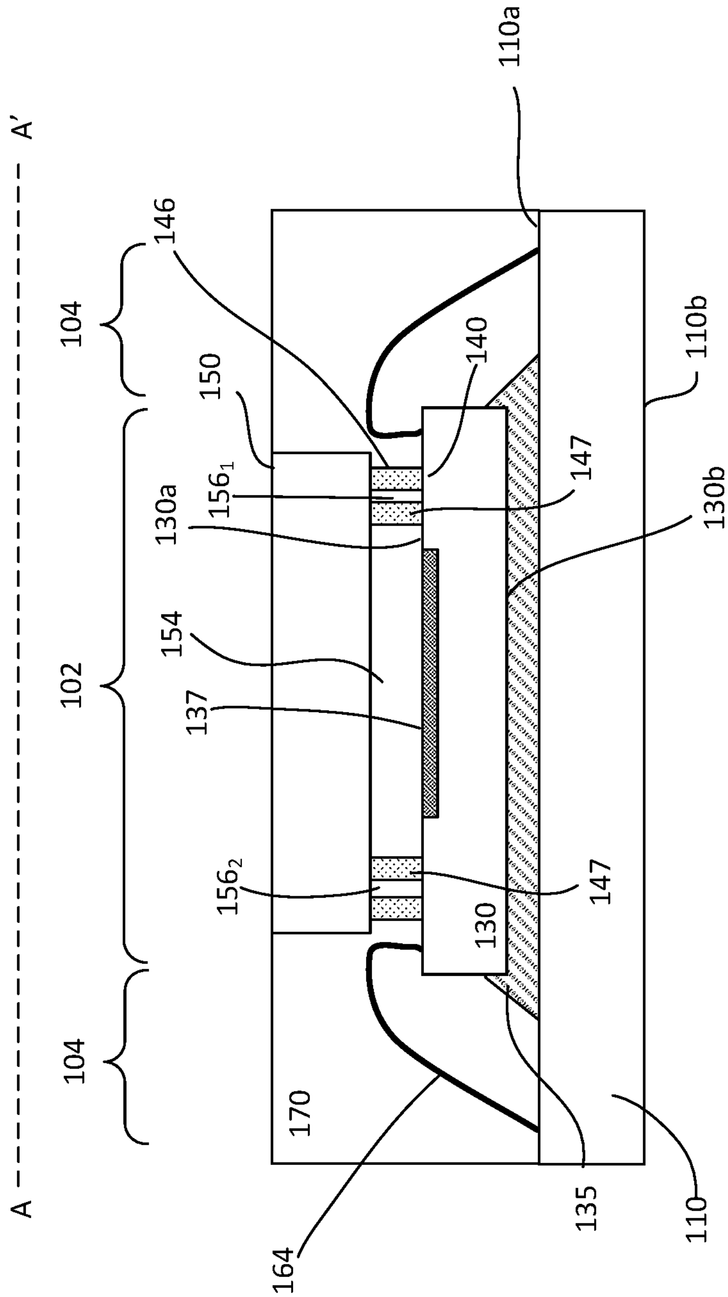

FIGS. 3*a* to 3*c* show top and side cross-sectional views of various embodiments of a semiconductor package 300. In particular, FIG. 3*a* shows a top cross-sectional view of a semiconductor package 300 with the package cover, and FIGS. 3*b* to 3*c* show side cross-sectional views taken along the A-A of different semiconductor packages 300. The various embodiments include common elements. Common elements may not be described or described in detail.

The package 300 is similar to that described in FIGS. 2*a* to 2*c*. For example, the cavity region between the protective cover and the active die surface includes 3 cavities. However, unlike FIGS. 2*a* to 2*c*, the side secondary cavities $\mathbf{156}_{1\text{-}2}$ are not abutting each other. Instead, they are abut to opposing sides of the primary cavity 154. Alternatively, the side secondary cavities may be abutted to adjacent sides of the primary cavity. Other configurations for the cavities may also be employed. Providing shapes other than rectangular-shaped cavities may also be useful.

Figure 4A:
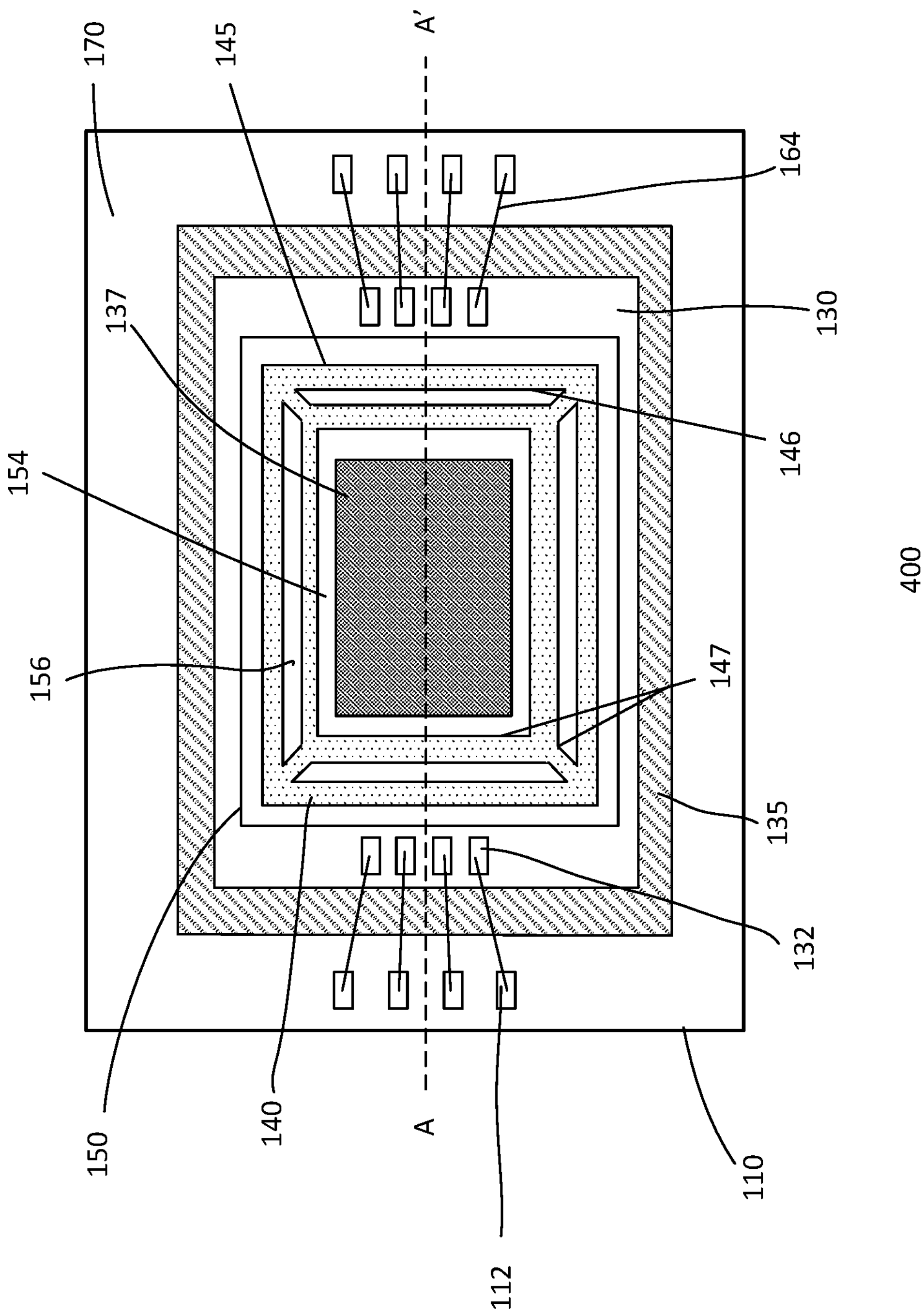
FIGS. 4_a_ to 4_c_ show top and side cross-sectional views of various embodiments of another semiconductor package.
Figure 4B:
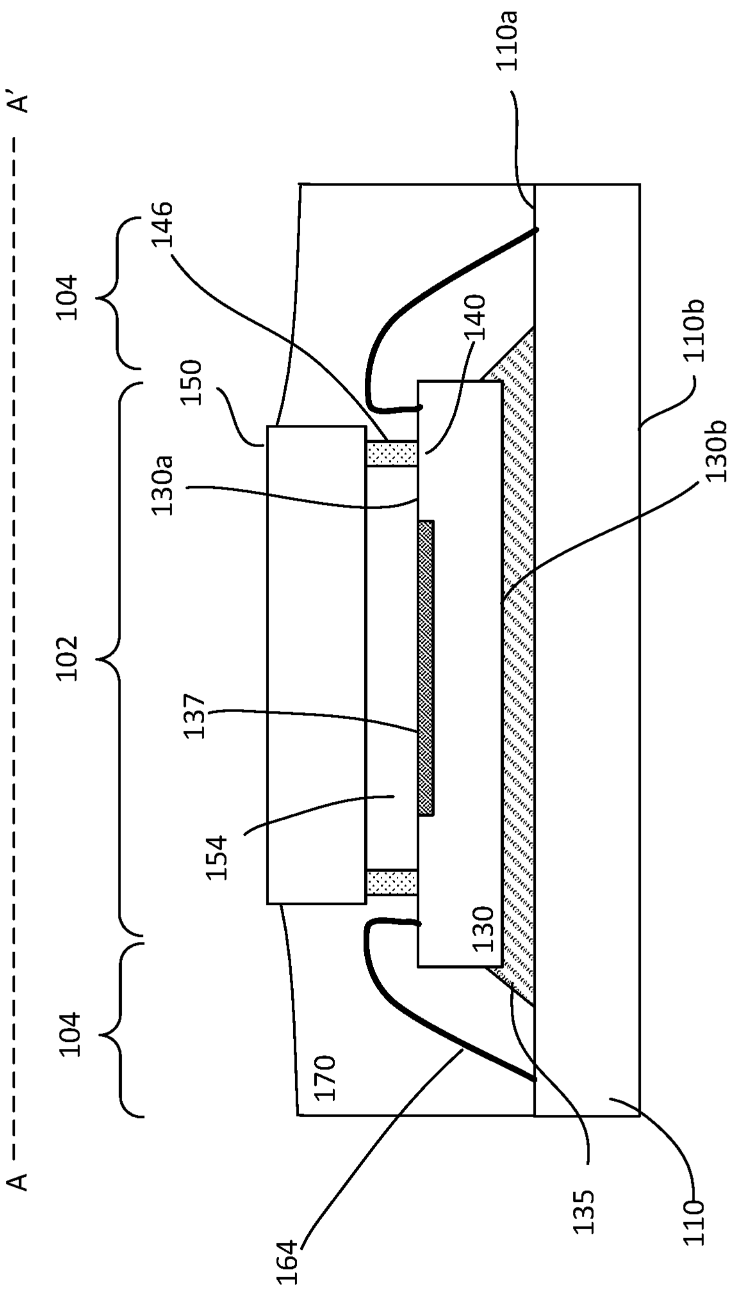
Figure 4C:
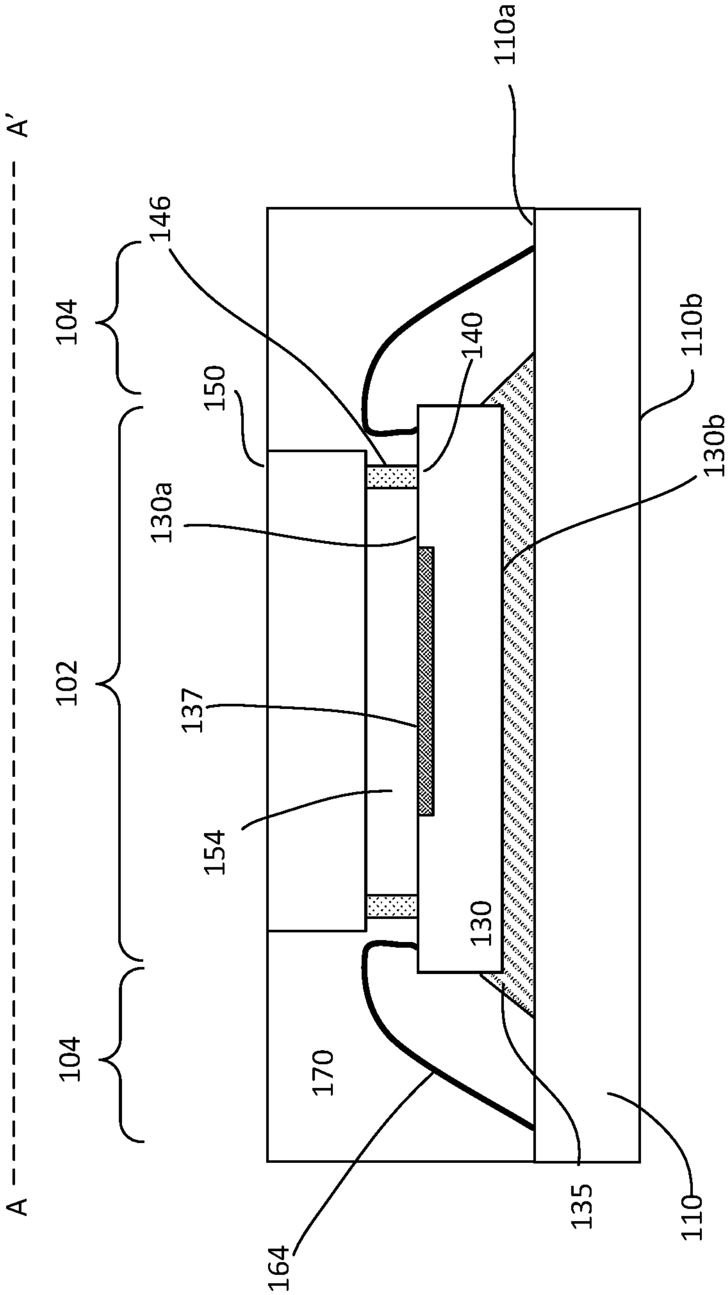

FIGS. 4*a* to 4*c* show top and side cross-sectional views of various embodiments of a semiconductor package 400. In particular, FIG. 4*a* shows a top cross-sectional view of a semiconductor package 400 with the package cover, and FIGS. 4*b* to 4*c* show side cross-sectional views taken along the A-A of different semiconductor packages 400. The various embodiments include common elements. Common elements may not be described or described in detail.

The package 400 is similar to that described in FIGS. 1*a* to 1*c*. However, unlike FIGS. 1*a* to 1*c*, the standoff structure is configured to form 5 cavities in the cavity region between the protective cover and the active die surface. For example, the cavity region includes 1 primary cavity and 4 secondary cavities.

In this case, the standoff structure 145 includes internal standoff structure walls 147 to separate the cavity region into a primary cavity 154 surrounding the sensor region and secondary cavities 156 which surround and abut the primary cavity. For example, the secondary cavities are side secondary cavities respectively disposed along 4 sides outside the primary cavity. Alternatively, the secondary cavities can abut the primary cavity, one of the secondary cavities, or a combination thereof. Other configurations of the cavities may also be possible. As shown, the cavities need not necessarily share the same shape. The shape of the cavities may depend on the layout of, for example, the internal standoff structure walls. For example, the primary cavity is a rectangular-shaped cavity whereas the side secondary cavities are trapezium-shaped secondary cavities. Forming cavities having other shapes or with different shapes may also be useful.

Figure 5A:
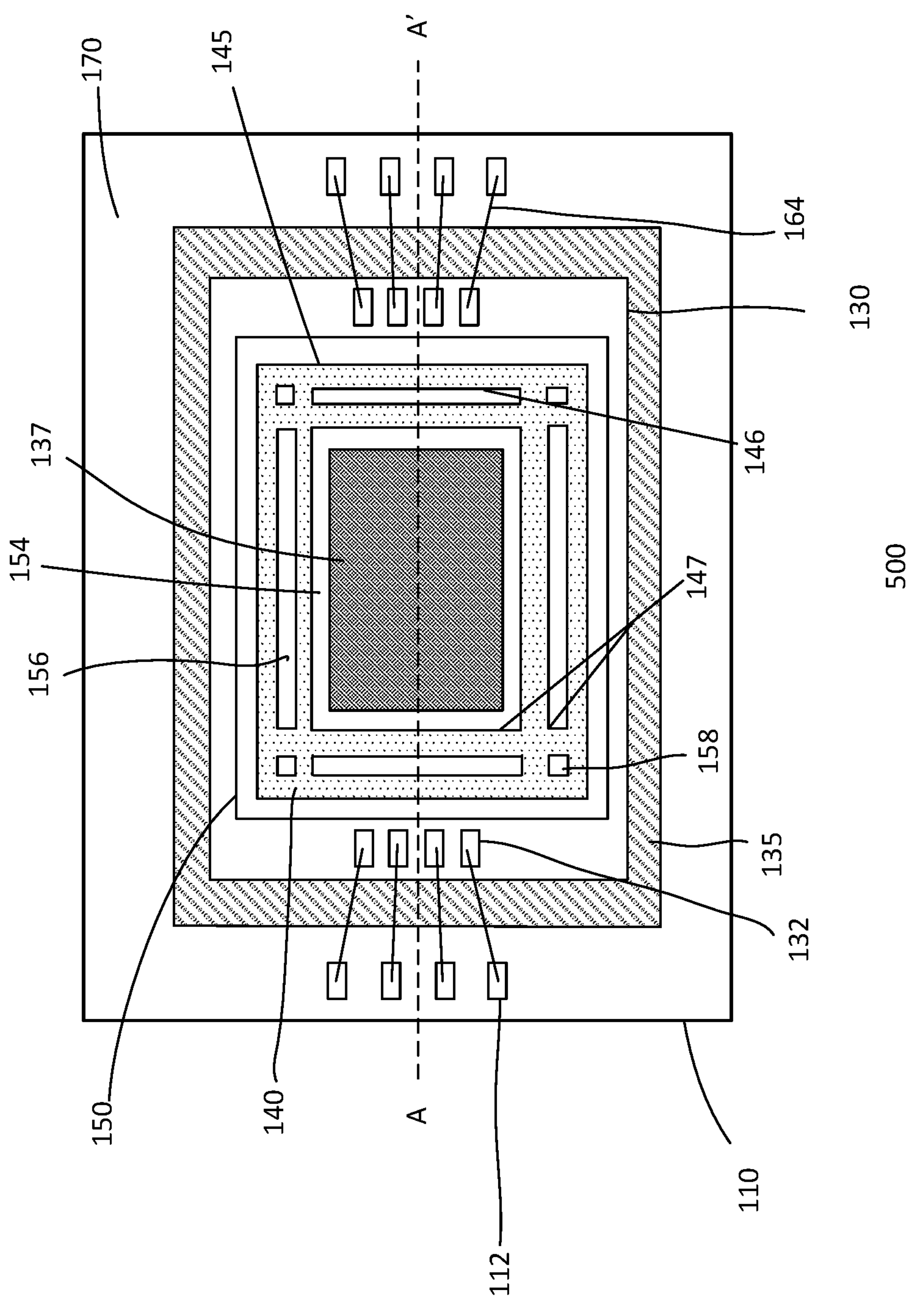
FIGS. 5_a_ to 5_c_ show cross-sectional views of various embodiments of a standoff structure formed on a semiconductor package.
Figure 5B:
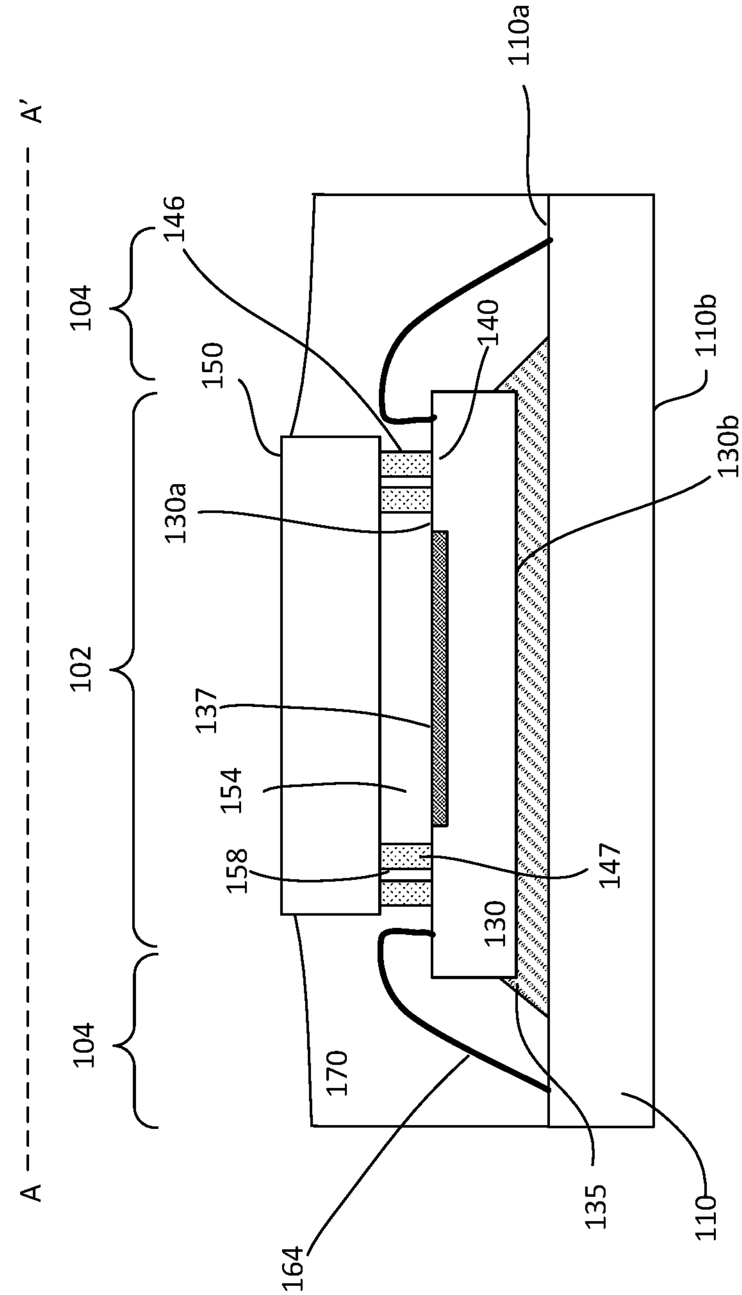
Figure 5C:
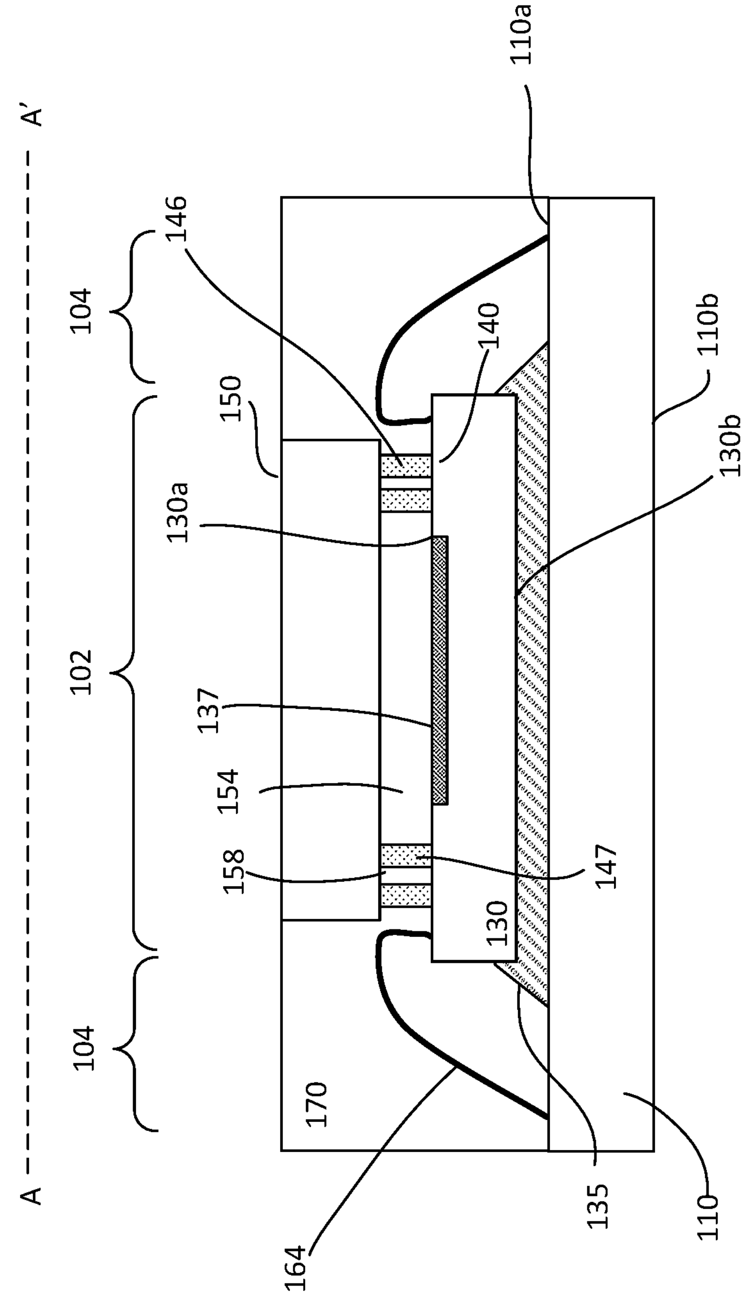

FIGS. 5*a* to 5*c* show top and side cross-sectional views of various embodiments of a semiconductor package 400. In particular, FIG. 5*a* shows a top cross-sectional view of a semiconductor package 500 with the package cover, and FIGS. 5*b* to 5*c* show side cross-sectional views taken along the A-A of different semiconductor packages 500. The various embodiments include common elements. Common elements may not be described or described in detail.

The package 500 is similar to that described in FIGS. 1*a* to 1*c*. However, unlike FIGS. 1*a* to 1*c*, the standoff structure is configured to form 9 cavities in the cavity region between the protective cover and the active die surface. For example, the cavity region includes 1 primary cavity and 8 secondary cavities.

As shown, the standoff structure 145 includes internal standoff structure walls 147 to separate the cavity region into a primary cavity 154 surrounding the sensor region and secondary cavities which surround the primary cavity. The secondary cavities, as shown, include 4 corner secondary cavities 158 and 4 side secondary cavities 156. The secondary cavities, as shown, are disposed along respective sides and corners of the cavity region. Other configurations of the secondary cavities may also be possible.

Figure 6:
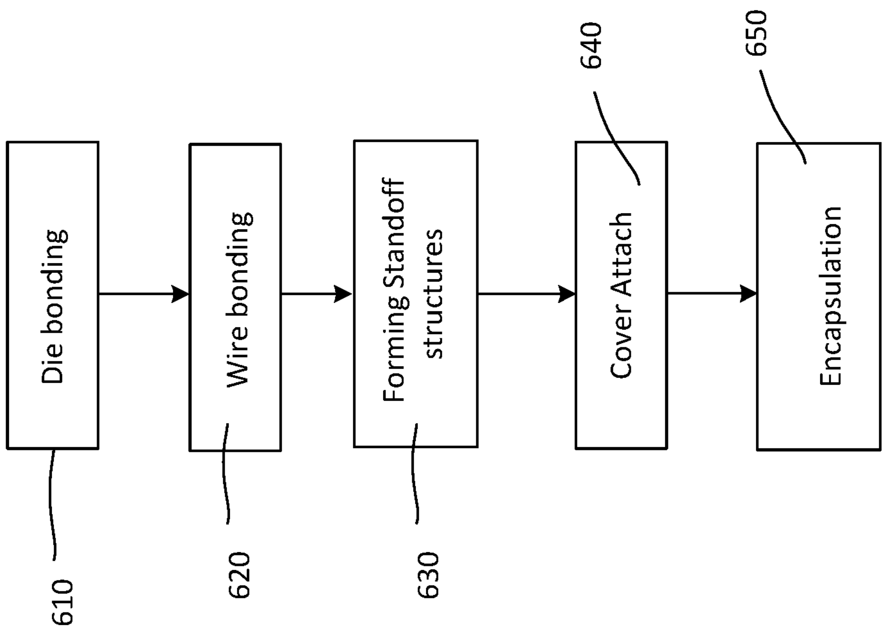
FIG. 6 shows an exemplary process of forming an embodiment of a semiconductor package.

FIG. 6 shows an exemplary process flow 600 of forming an embodiment of a semiconductor package. The package, for example, is similar to those described in FIG. 1*a* to FIG. 5*c*. Common elements may not be described or described in detail.

Referring to FIG. 6, the process flow 600, for example, commences at 610. For example, assembly of the package begins with providing a package substrate and attaching a die to the package substrate in 610.

The package substrate may include top and bottom package surfaces. The top package surface of the package substrate may include a die attach region and package bond pads disposed outside of the die attach region. The bottom package surface of the package substrate may include package contacts which are interconnected to the package bond pads on the opposing surface, for example, by one or more metal layers and via contacts embedded in the package substrate.

The die is attached to the die attach region, for example, by a die adhesive. The die adhesive may be an adhesive tape disposed on the die attach region. The die, for example, is temporarily attached to the die attach region. For example, a curing process may be performed to permanently attach the die to the die region. The bottom surface or inactive surface of the die, for example, contacts the die attach region. In one embodiment, the active die surface includes a sensor region. Depending on the application of the die, the sensor region may include a sensor or an array of sensors. The top or active die surface may include die bond pads disposed outside of the sensor region. For example, the die bond pads may be disposed on the non-sensor region of the active surface of the die.

In 620, wire bonds are formed. The wire bonds may be formed on die bond pads disposed outside of the cap bond region. Providing other arrangements for the die bond pads and the wire bonds may also be possible. For example, wire bonds may be formed on die bond pads disposed on a periphery of the cap bond region or a combination of cap bond region and outside of the cap bond region.

In 630, a standoff structure is formed thereafter. For example, the standoff structure is formed as an adhesive-based standoff structure disposed on the cap bond region surrounding the sensor region. The adhesive-based standoff structure completely surrounds the sensor region. The adhesive-based standoff structure may be formed by applying an adhesive on the cap bond region. The adhesive, for example, may be a curable transparent adhesive. Providing other materials for the adhesive may also be possible.

The standoff structure forms a cavity surrounding the sensor region. For example, the standoff structure includes outer standoff structure walls disposed on the outline of the cap bond region to define a cavity region between the protective cover and the active die surface. The cavity region, for example, includes a cavity. In one embodiment, the cavity may be a cavity having multiple cavities. For example, the cavity includes n cavities, where n is greater than 1, wherein the n cavities include 1 primary cavity and x secondary cavities, where x is equal to n−1. The primary cavity surrounds the sensor region while the secondary cavities can abut the primary cavity, another secondary cavity, multiple other secondary cavities, or a combination thereof.

To separate the cavity into multiple cavities, the standoff structure may be provided with one or more internal standoff structure walls. The number of internal standoff structure walls may depend on the number of cavities as well as the design or layout of the cap bond region. The shapes of the cavities may be rectangular or any other shapes. In addition, the cavities may share the same shape or have a combination of different shapes. The shape of the cavities may depend on the layout of, for example, the internal standoff structure walls. Preferably, the primary cavity is the largest while the secondary cavity or cavities are smaller in size. For example, the secondary cavities may be side secondary cavities which occupy a side of the cavity region and/or corner secondary cavities disposed at a corner of the cavity region. Other configurations of the standoff structures may also be useful.

At 640, a protective cover is attached to the die to seal the cavities in the cavity region. For example, the standoff structure serves to attach the protective cover over the sensor region. In one embodiment, the protective cover is diced from a cover substrate on which a plurality of protective covers are formed. The protective cover, for example, is a glass cover. Other types of protective cover may also be useful.

In one embodiment, wire bonds on the die bond pads are disposed outside of the protective cover. Providing other arrangements for the wire bonds and the die bond pads may also be possible. For example, in other embodiments, the die bond pads are disposed on the cap bond region and therefore portions of the wire bonds are covered by the protective cover.

In 650, an encapsulant is formed over the package substrate. The encapsulant covers the package substrate, exposed portions of the die and wire bonds, and sides of the protective cover. The material for forming the encapsulant may include ceramic, plastic, epoxy, or a combination thereof. The encapsulant may be formed by, for example, dispensing. For example, the encapsulant is a liquid encapsulant. In this case, the topmost surface of the encapsulant may be formed slightly below the top surface of the protective cover and slopes downwardly from the protective cover towards a perimeter of the non-die region outside of the die attach region. Other techniques or materials may also be employed for the encapsulant. For example, transfer molding using a mold compound may also be possible. In such cases, the package is encapsulated in an epoxy mold compound with vertical sidewalls and a substantially planar top surface that is about level with the top surface of the protective cover. The encapsulant is cured thereafter.

The inventive concept of the present disclosure may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

The invention claimed is:

1. A method for forming a semiconductor package comprising:

providing a package substrate having top and bottom major package substrate surfaces, the top major package surface includes a die attach region;

attaching a second major die surface of a die onto the die attach region, wherein a first major die surface of the die includes a sensor region and a cap bond region surrounding the sensor region;

forming a standoff structure on the cap bond region, the standoff structure is configured to define n cavities surrounding the sensor region, where n>2, wherein the n cavities are part of the final semiconductor package; and attaching a protective cover on the standoff structure, the protective cover seals the sensor region and forms n sealed cavities, wherein the n sealed cavities are configured to reduce thermal stress on the protective cover.

2. The method of claim 1 wherein the standoff structure includes an adhesive standoff structure.

3. The method of claim 2 further comprises:

forming wire bonds on die bond pads disposed on the first major die surface;

disposing adhesive on an outline of the cap bond region to form outer standoff structure walls of the adhesive-based standoff structure, wherein the outer standoff structure walls completely surround the sensor region to define a cavity region; and forming an internal standoff structure walls of the adhesive-based standoff structure in the cavity region to divide the cavity region into a primary cavity surrounding the sensor region and at least two secondary cavities adjacent and abutting the primary cavity.

4. The method of claim 3 wherein the primary cavity occupies a major area of the cavity region and the secondary cavities occupy minor areas of the cavity region.

5. The method of claim 3 wherein the secondary cavities are side secondary cavities.

6. The method of claim 1 further comprises forming wire bonds on die bond pads disposed on the first major die surface;

disposing an adhesive on an outline of the cap bond region to form outer standoff structure walls, wherein the outer standoff structure walls completely surround the sensor region to define a cavity region; and forming internal standoff structure walls in the cavity region to divide the cavity region into the n cavities.

7. The method of claim 6 wherein the n cavities include 1 primary cavity and 2 side secondary cavities, wherein the side secondary cavities are rectangular-shaped secondary cavities.

8. The method of claim 6 wherein the n cavities include 5 cavities with 1 primary cavity and 4 side secondary cavities abutting the primary cavity, wherein the side secondary cavities are trapezium-shaped secondary cavities.

9. The method of claim 6 wherein the n cavities include 1 primary cavity surrounding the sensor region and x secondary cavities, where x is equal to n−1.

10. The method of claim 9 wherein the x secondary cavities include side secondary cavities, corner secondary cavities, or a combination thereof.

11. The device of claim 1 wherein the standoff structure comprises:

outer standoff structure walls disposed on an outline of the cap bond region and completely surround the sensor region to define a cavity region; and an internal standoff structure wall disposed in the cavity region to divide the cavity region into the n cavities.

12. The device of claim 11 wherein then cavities include 1 primary cavity and x secondary cavities, where x is equal to n−1.

13. The device of claim 12 wherein the x secondary cavities include side secondary cavities, corner secondary cavities, or a combination thereof.

14. The device of claim 11 wherein then cavities include 5 cavities with 1 primary cavity and 4 side secondary cavities abutting the primary cavity, wherein the side secondary cavities are trapezium-shaped secondary cavities.

15. A device comprising:

a package substrate having top and bottom major package substrate surfaces, the top major package surface includes a die attach region;

a die having a second major die surface attached to the die attach region, wherein a first major die surface of the die includes a sensor region and a cap bond region surrounding the sensor region;

a standoff structure on the cap bond region, the standoff structure is configured to define n cavities surrounding the sensor region, where n>2; and a protective cover attached to the standoff structure, the protective cover seals the sensor region and forms the n sealed cavities wherein the n sealed cavities are configured to reduce thermal stress on the protective cover.

16. The device of claim 15 wherein the standoff structure includes an adhesive standoff structure.

17. The device of claim 16 wherein the adhesive standoff structure comprises:

outer standoff structure walls disposed on an outline of the cap bond region, the outer standoff structure walls completely surround the sensor region to define a cavity region; and internal standoff structure walls disposed in the cavity region to divide the cavity region into a primary cavity surrounding the sensor region and at least two secondary cavities adjacent and abutting the primary cavity.

18. The device of claim 17 wherein the primary cavity occupies a major area of the cavity region and the secondary cavities occupy a minor area of the cavity region.

19. The device of claim 17 wherein the secondary cavities are side secondary cavities.

20. The device of claim 15 wherein the sealed cavities include sealed air cavities.

* * * * *